United States Patent [19]

Cheng

[11] Patent Number: 5,334,365

[45] Date of Patent: Aug. 2, 1994

[54] SINGLE CESIUM TITANYL ARSENATE-TYPE CRYSTALS, AND THEIR PREPARATION

[75] Inventor: Lap K. Cheng, Bear, Del.

[73] Assignee: E. I. Du Pont de Nemours and Company, Wilmington, Del.

[21] Appl. No.: 888,945

[22] Filed: May 26, 1992

[51] Int. Cl.$^5$ .......................................... C01B 37/14
[52] U.S. Cl. .................................. 423/596; 423/179; 117/3; 117/17; 117/36; 117/80; 117/944
[58] Field of Search ................... 156/621, 622, 623 R, 156/624, DIG. 70, DIG. 71, DIG. 75; 423/179, 596

[56] References Cited

U.S. PATENT DOCUMENTS

| | | | |
|---|---|---|---|
| 3,949,323 | 4/1976 | Bierlein et al. | 332/7.51 |
| 4,231,838 | 11/1980 | Gier | 156/621 |
| 4,305,778 | 12/1981 | Gier | 156/DIG. 75 |
| 4,740,265 | 4/1988 | Bierlein et al. | 156/624 |
| 4,746,396 | 5/1988 | Marnier | 156/623 R |
| 4,761,202 | 8/1988 | Bordui et al. | 156/621 |
| 4,766,954 | 8/1988 | Bierlein et al. | 156/624 |
| 4,961,819 | 10/1990 | Marnier | 156/623 R |

FOREIGN PATENT DOCUMENTS 2220622 8/1988 United Kingdom ........... C30B 9/00

OTHER PUBLICATIONS

Acta. Cryst. (1989) C45, 1123–1125, *Structure Cristalline De CsTiO(AsO$_4$)*, Protas et al.
Sov. Phys. Crystallogr. 35(1), (Jan.–Feb. 1990,) 140–141, *Piezoelectric, elastic, and dielectric properties of RbTiOPO$_4$ crystals*, Sil'vestrova et al.
Inst. Phys. Conf. Ser. No. 103; Part 1, 65–68, *New non-linear optical materials of the KiTiOPO4 family*, Mangin et al. (1989).
Journal of Crystal Growth 99 (1990) 900–904, *Hydrothermal Growth of KTP Crystals in the Medium Range of Temperatures and Pressure*, Shou-Quan et al.
Journal of Crystal Growth 79 (1986) 970–973, *The Solubility of KTiOPO4 (KTP) in KF Aqueous Solution Under High Temperature and High Pressure*, Shou-quan et al.
Journal of Crystal Growth 74 (1986), 275–280, *Phase Relations, Solubility and Growth of Potassium Titanyl Phosphate, KTP*. Laudise et al.
Journal of Crystal Growth 23(1974) 65–70, *Top Seeded Solution Growth of Sodium Niobate*, Dawson et al.
Journal of Crystal Growth 74 (1986), 321–325, *On The Solution Growth of Solid Solutions*, Arend et al.
Appl. Phys. Lett., vol. 50, No. 18, (May 4, 1987), 1216–1218, Fabrication and Characterization of Optical Waveguides in KTiOPO$_4$, Bierlein et al.
J. Phys. Condens. Matter 1 (1989) 5509–5513, *Ferroelectric transition and melting temperatures of new compounds: CsTiOAsO$_4$ and Cs$_x$M$_{1-x}$TiOAs$_y$P$_{1-y}$O$_4$ with M=K or Rb*, Marnier et al.
Journal of Crystal Growth 110 (1991), 697–703, *Crystal Growth of KTiOPO4 isomorphs from tungstate and molybdate fluxes*, Cheng et al.

Primary Examiner—Olik Chaudhuri
Assistant Examiner—Fehisa Garrett

[57] ABSTRACT

A flux process is disclosed for producing a single orthorhombic crystal of $Cs_{1-x}M_xTiOAsO_4$ (where M is Na, K, Rb, and/or Tl and x is from 0 to 0.4) wherein the dimension of the crystal along each axis is at least about 2 mm, and wherein the product at the dimensions along the three axes is at least about 15 mm$^3$. The process involves preparing a homogeneous melt containing the components for forming said crystal and a flux comprising oxides of Cs and As at a temperature no higher than the decomposition temperature of said orthorhombic crystal, the mole fraction of M relative to the total Cs+M in the melt being within the range of from 0 to about 0.2; introducing a seed crystal for said single crystal in the melt; activating the controlled crystallization on the seed crystal; and continuing the crystallization until formation of the single crystal is completed. Single crystals of $Cs_{1-x}M_xTiOAsO_4$ (including crystals at least about 5 mm×5 mm 5 mm) are also disclosed.

10 Claims, 2 Drawing Sheets

SINGLE CESIUM TITANYL ARSENATE-TYPE CRYSTALS, AND THEIR PREPARATION

FIELD OF INVENTION

This invention relates to single crystals of cesium titanyl arsenate and the like and to their preparation, and more particularly to larger crystals of cesium titanyl arsenate wherein cesium may optionally be partially replaced by another monovalent cation and to their preparation using flux growth procedures.

BACKGROUND OF THE INVENTION

Crystals of $KTiOPO_4$ and its analogs are considered highly useful because of their nonlinear optical properties. U.S. Pat. No. 3,949,323 teaches the use of flaw-free crystals in the nonlinear optical and electro-optical applications. In addition, Sil'vestrova, et al. ("Piezoelectric, elastic, and dielectric properties of $RbTiOPO_4$", Soy. Phys. Crystallogr. 35, 140–141 (1990) reported that these crystals should be useful in piezoelectric applications. Whereas the growth of large inclusion-free single crystal of $KTiOPO_4$, $KTiOAsO_4$, $RbTiOPO_4$ and $RbTiOAsO_4$ were successfully demonstrated by Cheng, et. al., "Crystal Growth of $KTiOPO_4$ Isomorphs from Tungstate and Molybdate Fluxes", J. of Crystal, 110, 697–703 (1991), the growth of large (e.g., about $5 \times 5 \times 5$ mm$^3$ or greater) single crystals of $CsTiOAsO_4$ was unsuccessful using similar flux growth procedures. Nevertheless, due to its significantly lower ionic conductivity and its ability to efficiently frequency double the 1.3 $\mu$m line of the Nd:YAG laser, $CsTiOAsO_4$ continues to be preferred over $KTiOPO_4$ for many device applications. Accordingly, processes suitable for the growth of large single crystals of $CsTiOAsO_4$ are of interest.

Crystals of $KTiOPO_4$ and its analogs are known to melt incongruently at temperatures from 1100° C. to 1150° C. Flux methods disclosed in U.S. Pat. Nos. 4,231,838 and 4,746,396 are commonly used to grow such crystals below these temperatures, typically from 850° C. to 960° C. Hydrothermal methods are also commonly used for the production of the crystal $KTiOPO_4$. U.S. Pat. Nos. 4,305,778 and 3,949,323, as well as others, teach the preparation of $KTiOPO_4$ crystals by these methods.

The orthorhombic, Pna2$_1$ composition $CsTiOAsO_4$ was first reported by Protas and coworkers ("Structure Cristalline de $CsTiO(AsO_4)$", Acta Cryst., C45, 1123–1125, (1989)). Although small crystals of $CsTiOAsO_4$ from about a few hundred microns to a few millimeters have been synthesized by the aforemention methods (see for example, Marnier et. al., "Ferro-electric transition and melting temperatures of new compounds: $CsTiOAsO_4$ and $Cs_{1-x}M_xTiOP_{1-y}As_yO_4$," where M is K or Rb," J. Phys.: Condens. Matter, 1, 5509–5513 (1989)), the growth of large single crystals of $CsTiOAsO_4$ greater than about $5 \times 5 \times 5$ mm$^3$ has not been reported. This is believed to be due to a heretofore unreported structural instability of $CsTiOAsO_4$ resulting in the decomposition of the orthorhombic structure into a cubic, Cs-deficient structure at about 960° C. This limits the maximum flux growth temperature to be no higher than about 960° C. The aforementioned hydrothermal crystal growth methods are also considered ineffective because they generally result in the crystallization of the Cs-deficient compound having the cubic structure.

SUMMARY OF THE INVENTION

This invention provides for a flux process for producing a single orthorhombic crystal of $Cs_{1-x}M_xTiOAsO_4$ wherein M is selected from the group consisting of Na, K, Rb, Tl and mixtures thereof, wherein x is from 0 to 0.4, wherein the dimension of the crystal along each axis is at least about 2 mm and wherein the product of the dimensions along the three axes is at least about 15 mm$^3$; comprising the steps of preparing a homogeneous melt containing the components for forming said crystal and a flux comprising oxides of Cs and As at a temperature no higher than the decomposition temperature of said orthorhombic crystal, the mole fraction of M relative to the total Cs+M in said melt being within the range of from 0 to about 0.2; introducing a seed crystal for said crystal in the melt; actuating the controlled crystallization on the seed crystal; and continuing the crystallization until formation of the crystal is completed. Preferably, the crystallization is controlled to provide a crystal of at least $5 \times 5 \times 5$ mm$^3$. The invention includes crystal products of this process. This invention provides a single crystal of $Cs_{1-x}M_xTiOAsO_4$ wherein M is selected from Na, K, Rb, Tl and mixtures thereof, wherein x is from 0 to 0.4, and wherein the crystal is at least about $5 \times 5 \times 5$ mm$^3$.

Accordingly, the present invention provides not only a process for the preparation of single crystals of $CsTiOAsO_4$-type and a process of stabilizing the orthorhombic Pna2$_1$ structure of $CsTiOAsO_4$ by the partial replacement of cesium with smaller monovalent ions; but also large (e.g., $5 \times 5 \times 5$ mm$^3$) $Cs_{1-x}M_xTiOAsO_4$ crystals (where M is Na, K, Rb and/or Tl and x is up to about 0.4) suitable for fabricating useful electro-optic, nonlinear optical and piezoelectric devices.

DETAILED DESCRIPTION OF THE INVENTION

Figure 1:
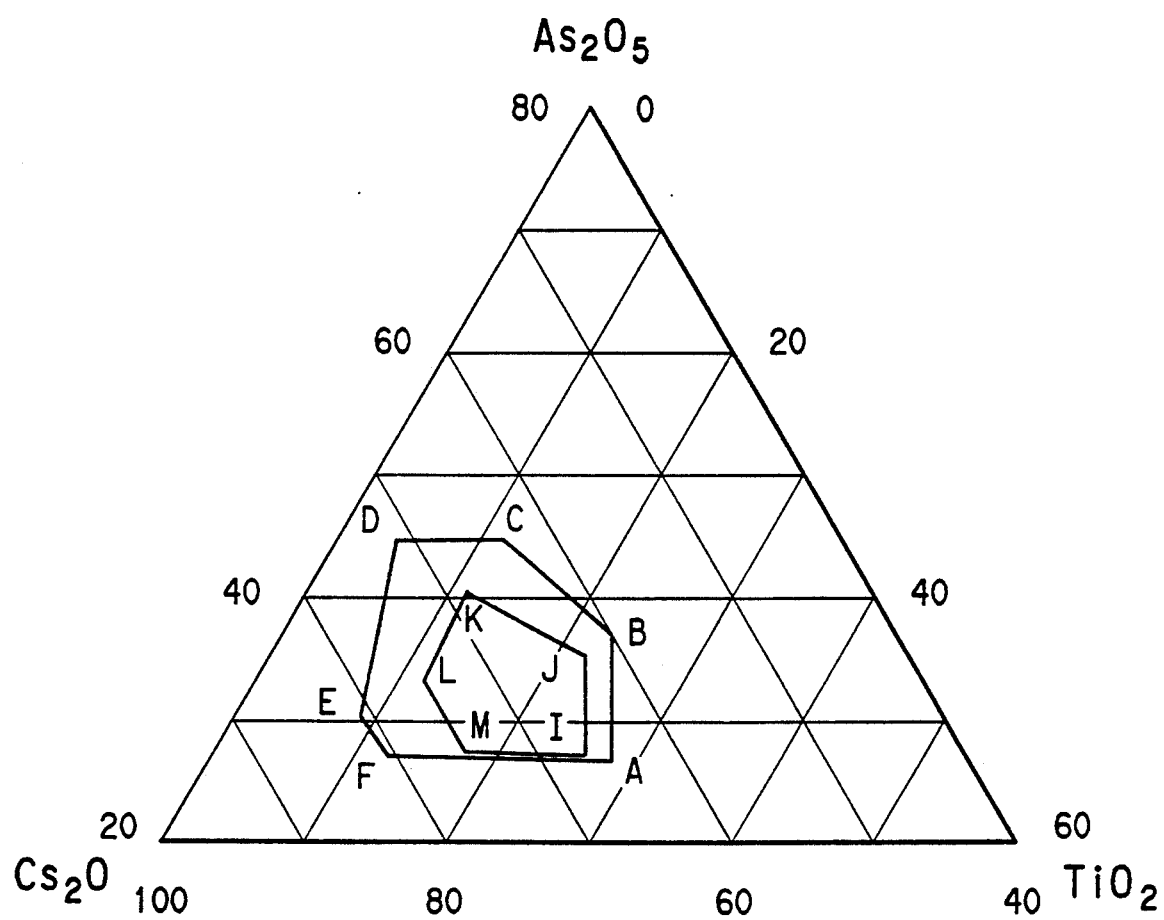
FIG. 1 is a $Cs_2O$-$TiO_2$-$As_2O_5$ ternary diagram which depicts a preferred and more preferred range within which the orthorhombic, Pna2$_1$ $CsTiOAsO_4$ crystals can be grown.

This invention involves consideration of a thermal decomposition reaction which limits the crystal growth temperatures for large single crystals grown using flux procedures, to no higher than the decomposition temperature, regardless of the fluxes used. The thermal decomposition reaction has been found to occur for $CsTiOAsO_4$ at about 960° C., and for cesium titanyl arsenate in which Cs has been partially replaced by Na, K, Rb and/or Tl at a somewhat higher temperature.

An advantageous range of melt-composition in the $Cs_2O$-$TiO_2$-$As_2O_5$ ternary (see FIG. 1) and an advantageous range of crystal growth temperatures (from 600° C. to 850° C.) have been developed in accordance with this invention, within which the orthorhombic $CsTiOAsO_4$ phase is stable such that large (e.g., at least about $5 \times 5 \times 5$ mm$^3$) single crystals can be crystallized in a routine manner. This invention further provides embodiments wherein the orthorhombic Pna2$_1$ structure is stabilized by partially replacing the large Cs ions with the smaller Na, K, Rb and/or Tl ions. For example, a substitution of about 5%, corresponding to the composition $Cs_{0.95}M_{0.05}TiOAsO_4$, where M is Na, K, Rb and/or Tl, is effective in raising the decomposition temperatures and making the growth of large single crystals much easier without sacrificing on the desirable optical and piezoelectric properties.

A $CsTiOAsO_4$ crystal produced by the processes described in this invention has the orthorhombic structure of $KTiOPO_4$ with the $Pna2_1$ space group and is particularly suitable for nonlinear optical, electrooptical and piezoelectrical applications.

The process of this invention for producing a single crystal of $CsTiOAsO_4$ of sufficient quality and size (at least about 2 mm along each axis, with the product of the dimensions along the three axes being at least about 15 $mm^3$, and preferably at least about $5 \times 5 \times 5$ $mm^3$) for use in practical devices employs conventional flux process steps, including preparing a homogeneous melt containing the components for forming $CsTiOAsO_4$ crystals and a flux comprising oxides of Cs and As and/or other flux modifiers such as cesium flouride; introducing a seed crystal of $CsTiOAsO_4$ in the melt; actuating the controlled crystallization on the seed; and continuing the process until the crystallization of the crystalline composition is completed.

Controlled crystallization may be actuated by either the slow cooling method or by the gradient transport method. In the slow cooling method, a homogeneous melt capable of yielding $CsTiOAsO_4$ is slowly cooled at a rate not greater than 10° C./hr in the presence of the seed. The melt is maintained at substantially isothermal conditions as the temperature is decreased continuously until the crystallization is completed. In the gradient transport process, an excess amount of crystalline CsTiOAsO_4 nutrients is placed at the bottom of the melt which is kept hotter than the upper part of the melt where the seed resides. In the presence of the temperature gradient, the flux dissolves the nutrients at the bottom and releases it on the surfaces of the seed leading to crystal growth. The use of multiple seeds and of forced convections are common in both of these methods. Examples 1 and 2 below exemplify the preparation process using the slow cooling method, while Example 3 below exemplifies the preparation process using the gradient transport method.

Figure 2:
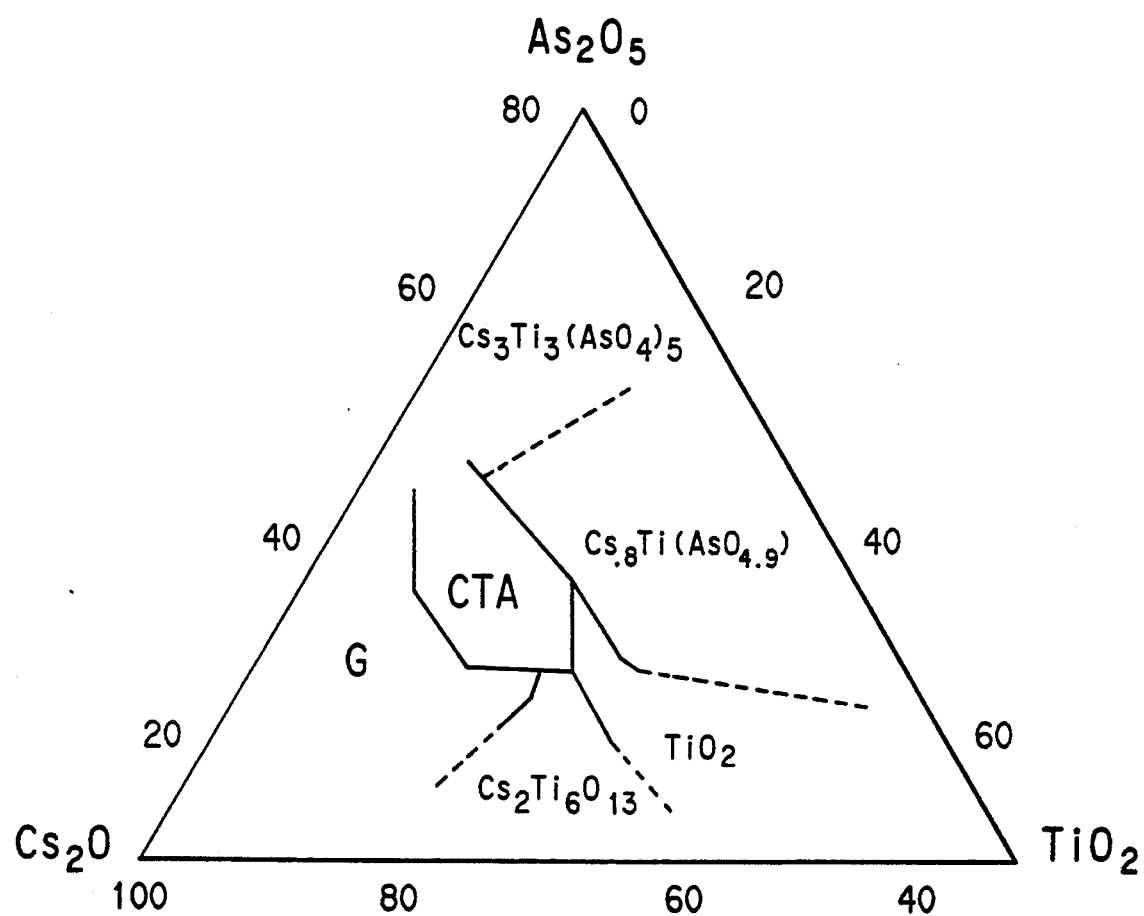
FIG. 2 shows the distribution of cesium titanyl arsenate (CTA) and other solid compositions formed in the $Cs_2O$-$TiO_2$-$As_2O_5$ ternary (region G is considered a glassy composition).

The melt composition consistent with the process of this invention in the $Cs_2O$-$TiO_2$-$As_2O_5$ ternary for producing the orthorhombic $CsTiOAsO_4$ crystal is shown by the polygon ABCDEFA, preferably polygon IJKLMI, in FIG. 1. Although in theory, the seeding temperature can be as high as the thermal decomposition temperature (about 960° C.) of $CsTiOAsO_4$, because of the potential for formation of rutile (i.e., $TiO_2$) crystals in the the $Cs_2O$-$TiO_2$-$As_2O_5$ ternary (see FIG. 2) the maximum seeding temperature is preferably no higher than about 850° C. However, with appropriate flux modifiers, it is expected that the maximum seeding temperature may be increased to 960° C. The seeding temperature of the process of this invention (i.e. the temperature of the melt when the seed crystal of $CsTiOAsO_4$ is suspended therein) is preferably within the range of from 600° C. to about 850° C., particularly for melt compositions within the polygon ABCDEFA; and is more preferably from 700° C. to 820° C., particularly for melt compositions within the polygon IJKLMI.

Suitable fluxes include $Cs_6As_4O_{13}$, $Cs_5As_3O_{10}$, and $Cs_4As_2O_7$. $Cs_5As_3O_{10}$ is a preferred flux.

The process of this invention can be practiced in any apparatus which calls for the maintenance of appropriate thermal conditions in the melt while suspending the seed crystal therein. Suitable apparatuses for the practice of the slow cooling method described in this invention are described in U.S. Pat. No. 4,761,202 and by Cheng, et. al., "Crystal Growth of $KTiOPO_4$ Isomorphs from Tungstate and Molybdate Fluxes", J. of Crystal, 110, 697–703 (1991). Similarly, Dawson et. al., "Top Seeded Solution Growth of Sodium Niobate", J. of Crystal Growth, 23 65–70 (1974) describes apparatus suitable for the crystal growth of $CsTiOAsO_4$ by the gradient transport method.

This invention further provides for the partial Cs-substitution of $CsTiOAsO_4$ with M, where M is Na, K, Rb and/or Tl. This substitution stablizes the orthorhombic $Pna2_1$ structure by raising the decomposition temperatures, and thus the maximum seeding temperatures. According to this invention, M may be added to the melt in a mole fraction, Q, up to about 0.2, calculated by the Equation:

$$Q = \text{mole fraction } M = \frac{\text{mole of } M \text{ in melt}}{\text{mole of } M \text{ in melt} + \text{mole of } Cs \text{ in melt}}$$

Preferably, in order to provide crystals having characteristics substantially similar to those of $CsTiOAsO_4$ (i.e., where x is about 0.1 or less), the mole fraction, Q, is about 0.05 or less. A preferred range for Q for improving the isometric crystal growth characteristics and increasing the decomposition temperature while maintaining the desired characteristics in the product crystal is about 0.01 to 0.05. TABLE 1 summarizes the increase in the decomposition temperatures due to the replacement of Cs by M, where M is K or Rb. The decomposition temperatures were measured by differential thermal analysis of single crystals of $Cs_{1-x}M_xTiOAsO_4$ crystals and the degrees of Cs-substitution, as expressed by x, were measured by inductively coupled plasma atomic emission spectroscopy. In addition to increasing the maximum seeding temperature, the partial Cs-replacement brings about a significantly improved crystal morphology resulting in crystals of more isometric dimensions. Comparison of Example 4 with Comparative Example A below illustrates this crystal morphology modification by partial K-substitution, even when crystals are prepared using spontaneous nucleation.

TABLE 1

| Increase of Decomposition Temperature Upon Partial Replacement of Cs ions with K or Rb ions | |
|---|---|
| Crystal | Decompostion Temperature, °C. |
| $CsTiOAsO_4$ | 960 |
| $Cs_{.8}K_{.2}TiOAsO_4$ | 1005 |
| $Cs_{.6}K_{.4}TiOAsO_4$ | none (melts @ 1025) |
| $Cs_{.77}Rb_{.23}TiOAsO_4$ | 1015 |
| $Cs_{.54}Rb_{.46}TiOAsO_4$ | none (melts @ 1042) |

Although not essential to the practice of this invention, an understanding of the underlying mechanism controlling the structural stability of $CsTiOAsO_4$ helps to illucidate the practice of this invention. At about 960° C., $CsTiOAsO_4$ decomposes into a cubic, Cs-deficient compound such as $Cs_{0.8}Ti(AsO_{4.9})$ (see FIG. 2) by the reaction:

$$CsTiOAsO_4 \rightarrow Cs_{(1-2\delta)}TiAsO_{(5-\delta)} + \delta Cs_2O (\uparrow)$$
where $0.1 < \delta < 0.15$ In sealed container where the oxide cannot escape, this reaction is reversible. A 'threatened-structure' model can be used to explain this decomposition. The crystal structure of $KTiOPO_4$ can be viewed as a relatively open framework of crosslinking $(TiOXO_4)$ groups, where $X = \{P, As\}$. This framework contains channels which are filled with the cations, such as K, Rb, Tl and Cs. This structure model has been used successfully by Bierlein et. al, "Fabrication and characterization of optical waveguides in $KTiOPO_4$" Appl. Phys. Letters, 50, 1216–1218 (1987), in explaining the observed ionic-conductivity in $KTiOPO_4$ crystals.

For $CsTiOAsO_4$ crystals, the $(TiOAsO_4)$ framework is more or less rigid such that the channels can only accommodate cations of up to a maximum size before the framework falls apart, then as one increases the cationic radius by going from K to Rb and to Cs, the stability of the $Pna2_1$ structure becomes more and more 'threatened', leading to the collapse (i.e., decomposition) of the $Pna2_1$ $CsTiOAsO_4$ structure at high temperatures in favor of a cubic structure containing less Cs relative to Ti and As. However, by replacing some of the larger Cs ions with smaller K or Rb ions, the $(TiOAsO_4)$ framework becomes less threatened, which amounts to the stabilization of the $Pna2_1$ structure described above.

The process of preparing single crystals of $Cs_{1-x}M_xTiOAsO_4$ crystals employs essentially similar flux process steps as employed for the preparation of single crystals $CsTiOAsO_4$ described above. The melt composition consistent with this invention contains the components for forming $Cs_{1-x}M_xTiOAsO_4$ crystals and a flux comprising oxides of Cs and As. In addition, the melt contains sufficient M (i.e., Na, K, Rb and/or Tl) to provide the desired amount of cesium replacement. A typical range for x is between 0.02 and 0.1. Because the smaller M ions are more readily incorporated into the growing crystal, the mole fraction of M in the melt (i.e., Q) is typically about one half of the mole fraction, x, desired in the crystal. Thus, although Q normally may range up to about 0.2, Q more typically ranges from 0.01 to 0.05. M is preferably Rb or K.

In general, the upper limit of the melt temperature is the decomposition temperature, $T_d$, of the crystal which increases from 960° C. with x and therefore with the mole fraction of M generally used in the melt (i.e., with Q). An approximate formula for the decomposition temperature, and thus the maximum melt temperature useable for growing orthorhombic crystals of crystal formula $Cs_{1-x}M_xTiOAsO_4$ is 960° C.+$R_m x$° C. where $R_m$ is the coefficient of increase in decomposition due to M-substitution; and x is the mole fraction of M in the crystal as defined by said crystal formula. In general, $R_m$ is roughly about 200. More exact values of $R_m$ can be determined in connection with particular M substituents. For example, where M is Na, $R_m$ may more precisely be characterized as about 180 (i.e., 180±40); where M is K, $R_m$ may more precisely be characterized as about 190 (i.e., 190±40); where M is Rb, $R_m$ may more precisely be characterized as about 210 (i.e., 210±40); and where M is Tl, $R_m$ may more precisely be characterized as about 215 (i.e., 215±40). More exact values of $R_m$ can also be experimentally determined for mixtures, but use of $R_m$ of 200 is considered satisfactory for these embodiments as well.

It is preferred in the practice of this invention to provide for mixing of the melt during the crystallization in order to ensure uniform distribution of M throughout the melt and the crystals. A particularly suitable way to accomplish this is to rotate the crucible in which the melt is contained with the sense of rotation periodically reversed. It is also preferred that the seed crystal be rotated as well to prevent the build-up of M near the growing crystal surfaces. The seed crystal is typically rotated from 2–200 revolution per minutes (rpm) and preferably from 10–100 rpm, while the crucible is typically rotated from 5–60 rpm and preferably from 10–30 rpm. It is further recognized that the gradient transport process is preferred over the slow cooling method, as it provides for better compositional uniformity throughout the growing crystal (see for example, Arend et. al., "On the Solution Growth of Single Crystals of Solid Solutions", J. of Crystal Growth, 74, 321–325 (1986)). The use of single-sectored growth is also preferred.

These preparative procedures provide single crystals of the cesium titanyl arsenate-type which are useful for nonlinear optics, electro-optics and piezoelectric applications.

The following non-limiting examples further illustrate practice of the invention.

EXAMPLE 1

A molten solution consisting of 0.6291 mole $CsTiOAsO_4$/0.55 mole $(Cs_{0.96}Na_{0.04})_5As_3O_{10}$ is made by reacting 407.9 g $Cs_2CO_3$, 6.29 g $Na_2CO_3$, 209.9 g $As_2O_5$ and 50.3 g $TiO_2$ in a 250 ml platinum crucible at about 1050° C. for 24 hours. The solution was then transferred into a top-loading furnace and homogenized at about 950° C. for 1 day. The melt was then cooled to about 830° C. (which was at least 90° C. lower than the lowest decomposition temperature observed) and a $11 \times 3 \times 1$ mm$^3$ seed crystal was introduced into the melt with the aid of a crystal pulling and rotation mechanism. The system was then cooled at an averaged rate of 1°–2° C./day to about 790° C. with a crystal rotation rate of 5–40 rpm. The crytal was then withdraw from the melt and annealed down to room temperature at 20° C./hr. to yield a $11 \times 20 \times 30$ mm$^3$ (about 14.7 g) crystal of $CsTiOAsO_4$. Several $3 \times 3 \times 4$ crystals were cut from this crystals for device fabrication.

EXAMPLE 2

A molten solution consisting of 0.5863 mole $CsTiOAsO_4$/0.3216 mole $Cs_6As_4O_{13}$ was made by reacting 409.8 g $Cs_2CO_3$, 215.2 g $As_2O_5$ and 46.8 g $TiO_2$ in a 250 ml platinum crucible at about 1050° C. for 24 hours. The solution was then transferred into a top-loading furnace and homogenized at about 920° C. for 1 day. The melt was then cooled to about 835° C. and a $10 \times 6 \times 1$ mm$^3$ seed crystal was introduced into the melt with the aid of a crystal pulling and rotation mechanism. The system was then cooled at an averaged rate of 1°–2° C./day to about 810° C. with a crystal rotation rate of 5–40 rpm. The crytal was then withdraw from the melt and annealed down to room temperature at 20° C./hr. to yield a $10 \times 22 \times 32$ mm$^3$ (about 15.2 g) crystal of $CsTiOAsO_4$.

EXAMPLE 3

An additional 30 g of small $CsTiOAsO_4$ crystals was added to the charge described in Example 1. The solution was then placed in a top-loading furnace equiped with a two-zone heater. The melt was allowed to equilibrate at about 825° C. for 1 day during which time the 30 g of excess $CsTiOAsO_4$ crystals precipitate out at the bottom of the crucible. A seed crystal of about $3 \times 1 \times 1$ mm$^3$ (about 0.15 g) was submerged into the melt. A temperature gradient of about 3° C. in the melt was then set-up by preferentially heating the bottom zone while cooling the top-zone. To avoid dissolving the seed, care must be taken to maintain the average melt temperature at 825° C. A crystal rotation rate of 520 rpm was used during the 4 days growth period. Upon withdraw from the melt, the crystal was annealed down to room temperature at about 80° C./hr. The resulting crystal shows a well formed morphology and measured $10 \times 8 \times 14$ mm$^3$ ( about 2.1 g).

EXAMPLE 4

A molten solution of 0.2245 mole $Cs_{0.91}K_{0.09}TiOAsO_4$/0.1423 mole $(Cs_{0.95}K_{0.05})_5As_3O_{10}$ was made by reacting 146.72 g $Cs_2CO_3$, 3.23 g $K_2CO_3$, 74.87 g $As_2O_5$ and 17.94 g $TiO_2$ in a 100 ml platinum crucible at about 1000° C. for 24 hours. The solution was then cooled first at 10° C./hr to 900° C. and then at 1°–5° C./hr to 700° C. to induce crystal growth from spontaneous nucleation. The molten flux was then poured off at this temperature and the crucible and its content were annealed down to room temperature at 60°–100° C./hr. The crucible content was then etched in hot water to removed the residual flux yielding about 9.5 g of $Cs_{0.91}K_{0.09}TiOAsO_4$ crystals which, compared with the crystals of Comparative Example A, had a (preferred) more isometric morphology like that typically found in the growth of materials such as $KTiOPO_4$. Crystals dimensions were typically 3 mm $\times$ 2 mm $\times$ 3 mm.

COMPARATIVE EXAMPLE A

A molten solution of 0.1875 mole $CsTiOAsO_4$/0.15 mole $Cs_5As_3O_{10}$ was made by reacting 151.5 g $Cs_2CO_3$, 72.4 g $As_2O_5$ and 14.4 g $TiO_2$ in a 100 ml platinum crucible at about 1000° C. for 24 hours. The solution was then cooled first at 10° C./hr to 900° C. and then at 1°–5° C./hr to 700° C. to induce crystal growth from spontaneous nucleation. The molten flux was then poured off at this temperature and the crucible and its content were annealed down to room temperature at 60°–100° C./hr. The crucible content was then etched in hot water to removed the residual flux yielding about 8 g of long prismatic crystals of $CsTiOAsO_4$. Crystals measuring up to 10 mm $\times$ 1 mm $\times$ 2 mm along the crystallographic a$\times$b$\times$c axes were obtained.

The examples serve to illustrate particular embodiments of the invention. Other embodiments will become apparent to those skilled in the art from a consideration of the specification or practice of the invention disclosed herein. It is further understood that the invention is not confined to the particular formulations and examples herein illustrated, but it embraces such modified form thereof as come within the scope of the following claims.

What is claimed is:

1. A flux process for producing a single orthorhombic crystal of $Cs_{1-x}M_xTiOAsO_4$ wherein M is selected from the group consisting of Na, K, Rb, Tl and mixtures thereof, wherein x is from 0 to 0.4, wherein the dimension of the crystal along each axis is at least about 2 mm, and wherein the product of the dimensions along the three axes is at least about 15 mm$^3$, comprising the steps of: preparing a homogeneous melt containing the components for forming said crystal and a flux comprising oxides of Cs and As at a temperature no higher than the decomposition temperature of said orthorhombic crystal, the mole fraction of M relative to the total Cs+M in the melt being within the range of from 0 to about 0.2; introducing a seed crystal for said single crystal in the melt; activating the controlled crystallization on the seed crystal; and continuing the crystallization until formation of the single crystal is completed.

2. The flux process of claim 1 wherein a single crystal of $CsTiOAsO_4$ is produced from a melt composition within the polygon ABCDEFA of FIG. 1 and wherein the seeding temperature is within the range of from 600° C. to about 850° C.

3. The flux process of claim 1 wherein a single crystal of $CsTiOAsO_4$ is produced from a melt composition within the polygon IJKLMI of FIG. 1 and wherein the seeding temperature is within the range of from 700° C. to 820° C.

4. The process of claim 1 wherein x ranges from 0.02 to 0.1 and said mole fraction of M in the melt ranges from 0.01 to 0.05.

5. The process of claim 4 wherein M is K or Rb.

6. The process of claim 1 wherein crystallization is controlled to provide a crystal of at least about $5 \times 5 \times 5$ mm$^3$.

7. A single orthorhombic crystal of $Cs_{1-x}M_xTiOAsO_4$ wherein M is selected from the group consisting of Na, K, Rb, Tl and mixtures thereof and wherein x is from 0 to 0.4 which is a product of the process of claim 1.

8. The single orthorhombic crystal of claim 7 which is a crystal of $CsTiOAsO_4$ and is at least $5 \times 5 \times 5$ mm$^3$.

9. A single crystal of $Cs_{1-x}M_xTiOAsO_4$ wherein M is selected from the group consisting of Na, K, Rb, Tl and mixtures thereof and x is from 0 to 0.4, and wherein the crystal is at least about $5 \times 5 \times 5$ mm$^3$.

10. The single crystal of claim 9 wherein x is from 0.02 to 0.1 and M is K or Rb.

* * * * *